United States Patent [19]

Tsurukiri et al.

[11] Patent Number: 4,891,296

[45] Date of Patent: Jan. 2, 1990

[54] PATTERN TRANSFER METHOD AND SILVER HALIDE PHOTOGRAPHIC PLATE TO BE USED FOR SAID METHOD

[75] Inventors: Shigeru Tsurukiri; Hiroshi Sugita, both of Hino; Toshio Yamamoto, Hikone; Masaru Kawasaki; Eiji Horie, both of Shiga, all of Japan

[73] Assignee: Konishiroku Photo Industry Co., Ltd., Tokyo, Japan

[21] Appl. No.: 44,947

[22] Filed: Apr. 30, 1987

[30] Foreign Application Priority Data

May 7, 1986 [JP] Japan .................. 61-103126

[51] Int. Cl.$^4$ .................. G03C 5/08; G03C 1/78
[52] U.S. Cl. .................. 430/142; 430/300; 430/302; 430/311; 430/5; 430/523; 430/950
[58] Field of Search .............. 430/142, 950, 300, 523, 430/5, 568, 311

[56] References Cited

U.S. PATENT DOCUMENTS

| | | | |
|---|---|---|---|
| 205,484 | 7/1878 | Hoefle et al. | 430/523 |
| 3,519,348 | 7/1970 | McLaughlin | 430/5 |
| 3,765,900 | 10/1973 | Depoorter et al. | 430/568 |
| 3,960,560 | 6/1976 | Sato | 430/5 |
| 4,248,948 | 2/1981 | Matsuda | 430/5 |
| 4,268,611 | 5/1981 | Okishi et al. | 430/300 |
| 4,557,994 | 12/1985 | Nagano et al. | 430/950 |
| 4,587,199 | 5/1986 | Bennett | 430/950 |
| 4,656,107 | 4/1987 | Moscony et al. | 430/950 |

*Primary Examiner*—Paul R. Michl
*Assistant Examiner*—Mark R. Buscher
*Attorney, Agent, or Firm*—Finnegan, Henderson, Farabow, Garrett and Dunner

[57] ABSTRACT

A silver halide photographic plate and a pattern transfer method comprising forming an original picture pattern on a first photographic plate having a silver halide emulsion layer on a glass support and contact transferring the original picture pattern onto a second photographic plate having a silver halide emulsion layer on a glass support or a substrate having a photoresist layer, characterized in that the first and second photographic plates comprise a silver halide emulsion contained in the emulsion layer which is a silver iodobromide emulsion containing 8 mol % or less of silver iodide and with its mean grain size being 0.1 μm or less; or contain a silver halide emulsion in the emulsion layer which contains 50 mol % or more of silver chloride; and that at least one of the first and second photographic plates has an emulsion layer with surface roughness of 0.3 μm to 3 μm, and a silver halide photographic plate to be used for the method.

By forming a pattern or a photoresist pattern according to the present invention, a copied pattern of good image quality can be obtained and also the aspirating evacuation time can be reduced.

4 Claims, No Drawings

PATTERN TRANSFER METHOD AND SILVER HALIDE PHOTOGRAPHIC PLATE TO BE USED FOR SAID METHOD

BACKGROUND OF THE INVENTION

This invention relates to a pattern transfer method and a silver halide photographic plate to be used for said method.

Heretofore, by use of a photographic plate comprising a silver halide emulsion formed on a glass support, it has been practiced to form an original picture pattern thereon and copy a pattern by transfer of said original picture pattern by contact exposure of this photographic plate onto another photographic plate, or to obtain a photoresist pattern by transfer of said original picture pattern by contact exposure onto a substrate having a photoresist layer.

Whereas, in the prior art techniques, contact during transfer of the original picture pattern by contact exposure is not necessarily sufficient, because of generation of contact irregularity, generation of Newton ring, etc., whereby good image quality may not be obtained even when transferred. Also, it is practiced to effect contact between the photographic plate and the pattern transfer medium by aspiration by means of an aspirating evacuation means, but this aspirating evacuation is time consuming such that bulk productivity is not improved.

In the case when a photoresist layer is formed on a substrate having a coated film of aluminum, etc., thereon and an original picture pattern on a photographic plate is desired to be transferred thereonto, it has been employed in various fields of electronic materials, such as in production of IC circuits, to transfer a circuit pattern by printing on the photoresist, followed by developing and etching working thereof to form a desired circuit. However, due to the above problem, resolving power cannot be enhanced, whereby a circuit with high reliability cannot be obtained. Also, when an aspirating evacuation means is used in order to increase contact for obtaining a good circuit, this will take a long time and thus productivity cannot be enhanced. Also, for the original picture pattern, it is frequently practiced to produce a duplicate pattern (working pattern) by transfer of the master pattern of said original picture to another photographic plate, but similar problems occur in this case.

In the photographic plate of the prior art as described above, there is the problem that no sufficient contact can be made during contact transfer of the original picture pattern.

SUMMARY OF THE INVENTION

An object of the present invention is to obtain a pattern transfer method in which contact can be sufficiently made by solving such problems and also to obtain a silver halide photographic plate to be used for this transfer method. By forming a pattern or a photoresist pattern according to the present invention, a copied pattern of good image quality can be obtained and also the aspirating evacuation time can be reduced.

The above object of the present invention can be accomplished by a pattern transfer method comprising forming an original picture pattern on a first photographic plate having a silver halide emulsion layer on a glass support and contact transferring said original picture pattern onto a substrate having a photoresist layer, characterized in that said photographic plates comprise a silver halide emulsion contained in the emulsion layer which is a silver iodobromide emulsion containing 8 mol % or less of silver iodide and with its mean grain size being 0.1 $\mu$m or less, or contain a silver halide emulsion in said emulsion layer which contains 50 mol % or more, of silver chloride and that said photographic plate has an emulsion layer with surface roughness of 0.3 $\mu$m to 3 $\mu$m. The present invention also relates to said photographic plates.

According to another aspect of the invention, a pattern transfer method comprises forming an original picture pattern on a first photographic plate having a silver halide emulsion layer on a glass support and contact transferring said original picture pattern onto a second photographic plate having a silver halide emulsion layer on a glass support, characterized in that said photographic plates comprise a silver halide emulsion contained in the emulsion layer which is a silver iodobromide emulsion containing 8 mol % or less of silver iodide and with its mean grain size being 0.1 $\mu$m or less, or contain a silver halide emulsion in said emulsion layer which contains 50 mol % or more, of silver chloride and at least the second photographic plate of said plates has an emulsion layer with surface roughness of 0.3 $\mu$m to 3 $\mu$m. The present invention also relates to said photographic plates.

DESCRIPTION OF THE PREFERRED EMBODIMENTS

The silver halide photographic plate to be used in the present invention is a photographic light-sensitive material of the so-called hard tone and high resolving power for plate preparation, etc. In the prior art, such a photographic plate has been desired to be made as smooth as possible on the emulsion layer surface. However, if it is too smooth, when contact transfer is effected to another photographic plate or a substrate having a photoresist layer, there has been involved a vital defect that contact degree is lowered.

In the present invention, by making the surface roughness of the emulsion layer within a specific range in the photographic plate having an emulsion layer having hard tone and high resolving power on a glass support, a transfer method extremely excellent in contact degree and a photographic plate to be used therefore can be obtained. In the present invention, since contact degree is good during pattern transfer, a transfer pattern with excellent image can be obtained, and it is not necessarily required to utilize a means such as aspirating evacuation, and even if such means may be employed, the time required can be shortened to enhance productivity.

The surface roughness of the emulsion layer in the silver halide photographic plate of the present invention is 0.3 $\mu$m to 3 $\mu$m as described above, and such roughening of the emulsion layer can be made according to various means. For example, a means for roughening the surface of the glass support can be used. By roughening the surface of the glass support, the surface of the emulsion layer formed thereon can be roughened, and therefore simultaneously with roughening of the glass substrate to the surface roughness as specified above, a suitable coating means may be employed. This can be accomplished by use of, for example, so-called ground glass as the glass support. Also, depending on the material of the emulsion layer, the surface of said emulsion layer can be made rough. This can be accomplished by incorporating a suitable substance into the emulsion, for example, the emulsion surface roughness can be made within the range as specified above by incorporating a matte agent in the emulsion layer.

The matte agent preferably used may include those as mentioned below.

That is, inorganic materials such as silicon dioxide, magnesium oxide, titanium dioxide, calcium carbonate, etc., organic materials such as polymethyl methacrylate, cellulose acetate propionate, etc., can be preferably used, and particularly those with particle diameters from 0.3 μm to 5 μm can be preferably used.

The surface roughness of the photographic plate of the present invention is 0.3 μm to 3 μm, and within this range, a suitable roughness can be selected depending on the desired purpose. Particularly, when used for high resolving power, the surface roughness is preferably 0.3 μm to 1 μm.

Here, the surface roughness as mentioned in the present specification refers to "10 point average roughness within the standard length of 0.8 mm", and may be determined, for example, by the surface roughness measurement method according to the feeler system from the average value of unevennesses at 10 spots in the interval within the scan length 0.8 mm of the sample.

Also, the grain size as mentioned in the present specification refers to the average grain size l, and this is the diameter in the case of a spherical silver halide grain, while it is an average value of the diameters of the circular images with the same area calculated from the projected images in the case of cubic grains or grains with shapes other than spherical shapes. When the individual grain sizes are represented by $r_i$, and their number by $n_1$, r is defined by the following formula.

$$ \text{ll} = \frac{\Sigma n_i r_i}{\Sigma n_i} $$

The above grain size can be measured according to various methods generally employed in the technical field concerned for their above purpose. Representative methods are described in Rabland "Grain Size Analytical Method" A.S.T.M. Symposium on Light Microscopy, 1955, p. 94–122 or "Logic of Photographic Process" by Mieth and James, 3rd edition, published by Mcmillan Co. (1966), Chap. 2. This grain size can be measured by use of a projected area or approximate value of diameter.

As the hydrophilic colloid to be used in the hydrophilic colloid layer such as silver halide emulsion layers in the photographic plate of the present invention, there may be included gelatin, albumin, casein, alginic acid, cellulose derivatives (e.g. hydroxyethyl cellulose, carboxymethyl cellulose, etc.), synthetic hydrophilic colloids (e.g. polyvinyl alcohol, poly-N-vinylpyrrolidone, etc.) and the like.

The photographic plate of the present invention has at least one silver halide emulsion layer on a glass support, and other than said layer, if necessary, a protective layer may be provided on the emulsion layer, and a subbing layer, etc., beneath the emulsion layer, etc. Also, it is possible to provide a backing layer containing a light absorbing dye on the surface on the opposite side to the silver halide emulsion layer, or to incorporate a light absorbing dye in the silver halide emulsion layer.

Light absorbing dyes may include oxanol dyes, hemioxanol dyes, melocyanine dyes, cyanine dyes, styryl dyes and azo dyes. Among them, oxanol dyes, hemioxanol dyes and melocyanine dyes are useful. Specific examples of available dyes are disclosed in, for example, German Pat. No. 616,007, U.K. Pat. No. 1,177,429, Japanese Patent Publication No. 38129/1976, Japanese Unexamined Patent Publication No. 185038/1982, U.S. Pat. No. 4,071,312, PB report No. 74115, PHOTO. ABS. 1 28 ('21), etc.

The silver halide grains to be used in the silver halide emulsion layer of the present invention can be added with metal ions by use of at least one selected from cadmium salts, zinc salts, lead salts, thallium salts, iridium salts (including complexes), rhodium salts (including complexes) and iron salts (including complexes) in the process of forming and/or growing grains to incorporate these metal elements internally and/or on the surface of the grains. Also, by placing in a reducing atmosphere, reducing sensitizing nuclei can be imparted internally of the grains and/or the surface of the grains.

In the silver halide emulsion in the silver halide emulsion layer of the present invention, unnecessary soluble salts may be removed or contained as such after completion of the growth of silver halide grains. When said salts are removed, it can be practiced on the basis of the method described in Research Disclosure No. 17643.

The silver halide emulsion of the present invention can be chemically sensitized in conventional manner. That is, it is possible to use the sulfur sensitization method, the selenium sensitization method, the reducing sensitization method, the noble metal sensitization method by use of gold or other noble metal compounds, etc., either singly or in combination.

The silver halide emulsion of the present invention can be optically sensitized to a desired wavelength region by use of a dye known as the sensitizing dye in the photographic business. A single sensitizing dye may be used, but two or more dyes may be used in combination. Together with a sensitizing dye, a dye which has itself no spectral sensitizing action, or a potentiating sensitizer which is a compound absorbing substantially no visible light but which intensifies sensitizing action of the sensitizing dye may be also contained in the emulsion.

As the sensitizing dye, cyanine dye, melocyanine dye, complex cyanine dye, complex melocyanine dye, holopolar cyanine dye, hemicyanine dye, styryl dye and hemioxanol dye may be employed.

Particularly useful dyes are cyanine dye, melocyanine dye and complex melocyanine dye. To these dyes, any of nuclei conventionally utilized to cyanine dyes as basic heterocyclic nucleus is applicable. That is, there may be included pyrroline nucleus, oxazoline nucleus, thiazoline nucleus, pyrrole nucleus, oxazole nucleus, thiazole nucleus, selenazole nucleus, imidazole nucleus, tetrazole nucleus, pyridine nucleus, and nuclei with alicyclic hydrocarbon ring fused to these nuclei and nuclei with aromatic hydrocarbon ring fused to these nuclei, namely, indolenine nucleus, benzindolenine nucleus, indole nucleus, benzoxazole nucleus, naphthoxazole nucleus, benzothiazole nucleus, naphthothiazole nucleus, benzoselenazole nucleus, benzimidazole nucleus, quinoline nucleus. These nuclei may be substituted on the carbon atom.

For melocyanine dyes or complex melocyanine dyes, as the nucleus having a ketomethylene structure, a 5- or 6-membered heterocyclic nucleus such as pyrazolin-5-one nucleus, thiohydantoin nucleus, 2-thiooxazolidine-2,4-dione nucleus, thiazolidine-2,4-dione nucleus, rhodanine nucleus, thiobarbituric acid nucleus, etc., can be applied.

As sensitizing dyes to be used in blue-sensitive silver halide emulsion layer, those as disclosed in German Pat. No. 929,080, U.S. Pat. No. 4,046,572, U.K. Pat. No. 1,242,588, Japanese Patent Publication No. 24844/1977, etc., may be included. Also, as sensitizing dyes to be used in green-sensitive silver halide emulsion, for example, cyanine dyes, melocyanine dyes or complex cyanine dyes as disclosed in U.S. Pat. No. 2,945,763, U.K. Pat. No. 505,979, etc., may be included as representative ones. Further, as sensitizing dyes to be used in red-sensitive emulsion, cyanine dyes, melocyanine dyes or complex cyanine dyes as disclosed in U.S. Pat. No. 2,776,280 may be included as representative ones. Further, cyanine dyes, melocyanine dyes or complex cyanine dyes as described in U.S. Pat. No. 2,519,001, German Pat. No. 929,080, etc., can be usefully employed in red-sensitive silver halide emulsion or green-sensitive silver halide emulsion.

These sensitizing dyes may be used either singly or as a combination thereof. The combination of the sensitizing dyes is frequently used for the purpose of color intensifying sensitization. Its representative examples are disclosed in Japanese Patent Publication No. 1569/1980, Japanese Unexamined Patent Publication No. 116647/1984 and U.S. Pat. No. 3,837,862.

As the dye which is used with a sensitizing dye and has itself no spectral sensitizing action or the substance which is a substance absorbing substantially no visible light but exhibiting color intensifying sensitization, there may be included, for example, aromatic organic acid-formaldehyde condensates (e.g. those disclosed in U.S. Pat. No. 3,347,510), cadmium salts, azaindene compounds, aminostilbene compounds substituted with nitrogen-containing heterocyclic group (e.g. those disclosed in U.S. Pat. Nos. 2,933,390 and 3,635,721). The combinations disclosed in U.S. Pat. Nos. 3,615,613, 3,615,641, 3,617,295 and 3,635,721 are particularly useful.

In the silver halide emulsion of the present invention, for the purpose of preventing fogging or maintaining photographic performance stably in the manufacturing steps, during storage or during photographic processing of light-sensitive material, compounds known as anti-foggants or stabilizers in photographic business can be added during chemical aging, on completion of chemical aging, and/or after completion of chemical aging until coating of the silver halide emulsion. As the antifoggant and the stabilizer, there may be included those azaindenes such as pentazaindenes disclosed in U.S. Pat. Nos. 2,713,541, 2,743,180 and 2,743,181, tetrazaindenes disclosed in U.S. Pat. Nos. 2,716,062, 2,444,607, 2,444,605, 2,756,147, 2,835,581 and 2,852,375, Research Disclosure No. 14851, triazaindenes disclosed in U.S. Pat. No. 2,772,164 and polymerized azaindenes disclosed in Japanese Unexamined Patent Publication No. 211142/1982; quaternary onium salts such as thiazolium salts disclosed in U.S. Pat. Nos. 2,131,038 and 3,342,596, 3,954,478, pyrylium salts disclosed in U.S. Pat. No. 3,148,067 and phosphonium salts as disclosed in Japanese Patent Publication No. 40665/1975; mercapto-substituted heterocyclic compounds such as mercaptotetrazoles, mercaptotriazoles, mercaptodiazoles as disclosed in U.S. Pat. Nos. 2,403,927, 3,266,897 and 3,708,303, Japanese Unexamined Patent Publications Nos. 135835/1980 and 71047/1984, mercaptothiazoles as disclosed in U.S. Pat. No. 2,824,001, mercaptobenzthiazoles and mercaptobenzimidazoles as disclosed in U.S. Pat. No. 3,397,987, mercaptooxadiazoles as disclosed in U.S. Pat. No. 2,843,491, mercaptothiadiazoles as disclosed in U.S. Pat. No. 3,364,028, etc.; polyhydroxybenzenes such as catecoles disclosed in U.S. Pat. No. 3,236,652, Japanese Patent Publication No. 10256/1965, resorcins disclosed in Japanese Patent Publication No. 44413/1981 and gallic acid esters as disclosed in Japanese Patent Publication No. 4133/1968; heterocyclic compounds such as azoles, i.e., tetrazoles disclosed in German Pat. No. 1,189,380, triazoles disclosed in U.S. Pat. No. 3,157,509, benztriazoles as disclosed in U.S. Pat. No. 2,704,721, urazoles as disclosed in U.S. Pat. No. 3,287,135, pyrazoles as disclosed in U.S. Pat. No. 3,106,467, indazoles as disclosed in U.S. Pat. No. 2,271,229 and polymerized benztriazoles as disclosed in Japanese Unexamined Patent Publication No. 90844/1984, pyrimidines disclosed in U.S. Pat. No. 3,161,515, 3-pyrazolidones as disclosed in U.S. Pat. No. 2,751,297, and polymerized pyrrolidones namely polyvinylpyrrolidones as disclosed in U.S. Pat. No. 3,021,213; various inhibitor precursors as disclosed in Japanese Unexamined Patent Publications Nos. 130020/1979, 137945/1984 and 140445/1984, U.K. Pat. No. 1,356,142, U.S. Pat. Nos. 3,575,699 and 3,649,267; sulfinic acid, sulfonic acid derivatives as disclosed in U.S. Pat. No. 3,047,393; inorganic salts as disclosed in U.S. Pat. Nos. 2,556,263, 2,839,405, 2,488,709 and 2,728,663.

The photographic emulsion layers and other hydrophilic colloid layers in the photographic plate of the present invention can harden films by use of at least one hardener which crosslinks the binder (or a protective colloid) molecules to enhance film strength. The film hardener can be added in an amount which can harden the film of the light-sensitive material to the extent such that no film hardener is required to be added in the processing solution, but it is also possible to add a film hardener in a processing solution.

As the film hardener, there may be employed film hardeners of aldehyde type, aziridine type (e.g. those disclosed in PB report No. 19,921, U.S. Pat. No. 3,271,175, Japanese Patent Publication No. 40898/1971, Japanese Unexamined Patent Publication No. 91315/1975), isooxazole type (e.g. those disclosed in U.S. Pat. No. 331,609), epoxy type (e.g. U.S. Pat. No. 3,047,394, German Pat. No. 1,085,663, U.K. Pat. No. 1,033,518, Japanese Patent Publication No. 35495/1973), vinylsulfone type (e.g. PB report No. 19,920, German Pat. No. 2,749,260, U.K. Pat. No. 1,251,091, Japanese Unexamined Patent Publication No. 62250/1975, U.S. Pat. No. 3,539,644), acryloyl type (e.g. Japanese patent application No. 27949/1973, U.S. Pat. No. 3,640,720), carbodiimide type (e.g. U.S. Pat. No. 4,061,499, Japanese Patent Publication No. 38715/1971, Japanese Patent Publication No. 38715/1971, Japanese patent application No. 15095/1974), triazine type (e.g. German Pat. Nos. 2,410,973 and 2,553,915, U.S. Pat. No. 3,325,287, Japanese patent application No. 12722/1977), polymer type (e.g. U.K. Pat. No. 822,061, U.S. Pat. No. 3,226,234, Japanese Patent Publications Nos. 18578/1972, 18579/1972 and 48896/1972), otherwise maleimide type, acetylene type, methane sulfonic acid ester type, N-methylol type, which can be used either singly or in combination. Useful combination techniques may include, for example, the combination as disclosed in German Pat. No. 2,514,245, U.S. Pat. No. 4,047,957, Japanese Unexamined Patent Publications Nos. 43319/1973, 63063/1975 and 127329/1977 and Japanese Patent Publication No. 32364/1973.

In the silver halide silver emulsion layers and/or other hydrophilic colloid layers of the photographic plate of the present invention, a plasticizer can be added for the purpose of enhancing flexibility.

In the photographic emulsion layers and other hydrophilic colloid layers in the photographic plate of the present invention, a dispersion of a water-soluble or partially soluble synthetic polymer (latex) can be included for the purpose of improving dimensional stability, etc.

As the partially soluble synthetic polymer, for example, those disclosed in U.K. Pat. No. 1,186,699, Japanese Patent Publication No. 25499/1974, U.S. Pat. No. 3,645,740, etc., can be preferably used.

The photographic emulsion layer in the photographic plate of the present invention may contain polyalkylene oxides or its derivatives such as ethers, esters, amines, etc., thioether compounds, thiomorpholines, quaternary ammonium compounds, urethane derivatives, urea derivatives, imidazole derivatives, etc., for the purpose of elevating sensitivity, elevating contrast or promoting development.

In the developing processing of the photographic plate of the present invention, any known processing can be used, including development according to lith developer (dye transfer developer) in which hydroquinone is used as the developing agent and sulfite ion concentration is low.

When a pattern is formed in the present invention, by use of the silver halide photographic plate of the present invention, an original picture pattern is formed on the silver halide photographic plate, the original picture pattern formed is pattern transferred by contact exposure to another photographic plate of the present invention having a silver halide emulsion layer on a glass support to form a pattern. This makes a duplicated pattern by use of the original picture pattern first formed on the photographic plate of the present invention as the master pattern and printing the master pattern by contact exposure onto another photographic plate of the present invention followed by development.

When a resist pattern is formed in the present invention, the above silver halide photographic plate is used, an original picture pattern is formed on the silver halide photographic plate, and the original pattern formed is pattern transferred by contact exposure onto a substrate having a photoresist layer to form a photoresist pattern. Also in this case, since the resist pattern is obtained by transfer from the photographic plate of the present invention, sufficient contact can be made.

The above photoresist layer is formed by coating a support with a photosensitive composition together with a binder. As the above photosensitive composition, various compositions may be available, but it is preferable to use a photosensitive composition developable with an alkali, including specifically, for example, a photosensitive resin composition containing o-quinonediazide as the photosensitive agent. Also, as the negative working type photosensitive composition, for example, there may be employed a composition comprising a blend of an azide type photosensitive agent such as 2,6-di(4'-azidobenzal)-cyclohexane and a phenol novolak resin and further a photopolymerization type photosensitive composition comprising a blend of a copolymer of benzyl methacrylate and methacrylic acid (e.g. at a molar ratio of 7:3), a polyfunctional monomer such as trimethylolpropane triacrylate as the binder and a photopolymerization initiator such as Micheler's ketone. Also, as the positive working type, there is, for example, a photosensitive resin composition containing o-quinonediazide as the photosensitive agent, and further it is possible to use a photosensitive resin composition containing (i) a compound capable of generating an acid by irradiation of active rays, (ii) a compound having at least one bond decomposable with an acid and (iii) a novolak resin containing two or three different phenols.

As the compound of (i), it is possible to use many known compounds and mixtures, including, for example, diazonium salts, phosphonium salts, sulfonium salts and salts of iodonium such as of $BF_4^-$, $PF_6^-$, $SbF_6^-$, $SiF_6^-$, $ClO_4^-$, etc., organic halide compounds, orthoquinonediazidesulfonyl chloride, and organometallic/organohalide compounds as the active ray sensitive component which forms or separates an acid during irradiation of active rays.

In principle, all organic halide compounds known as free radical forming photosensitive initiators can be used as the photosensitive compounds capable of forming hydrogen halide acid. Examples of such compounds are disclosed in U.S. Pat. Nos. 3,515,552, 3,536,489 and 3,779,778 and German OLS No. 2,243,621.

Also, it is possible to use the compounds capable of generating acid by photolysis as disclosed in German OLS No. 2,610,842, Japanese Unexamined Patent Publications Nos. 74728/1979, 77742/1980, 16323/1982 and 3626/1985.

The content of these compounds capable of generating acid by irradiation of active rays can be varied broadly depending on its chemical properties and the composition or physical properties of the photosensitive resin layer, but it is preferably within the range of about 0.1 to about 10% by weight based on the total weight of the solids in the photosensitive composition.

As the compound of (ii), for example, there may be included compounds having C—O—C bonds or →Si—O—C← bonds or compounds having

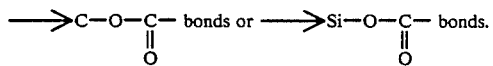

Specific compounds having →C—O—C← bonds may include, for example, compounds having acetal or ketal groups, compounds having orthocarboxylic acid ester groups and/or carboxylic amidoacetal groups disclosed in Japanese Unexamined Patent Publication No. 120714/1976, polymers having acetal or ketal groups in the main chain disclosed in Japanese Unexamined Patent Publication No. 133429/1978, compounds having enol ether groups disclosed in Japanese Unexamined Patent Publication No.12995/1980, compounds having N-acyliminocarbonate groups disclosed in Japanese Unexamined Patent Publication No. 126236/1980, or polymers having orthocarboxylic ester groups in the main chain disclosed in Japanese unexamined Patent Publication No. 17345/1981.

Also, specific compounds having →Si—O—C← bonds may be exemplified by the compounds disclosed in Japanese Unexamined Patent Publications Nos. 37549/1985, 52845/1985 and 121446/1985.

Also, specific compounds having ester groups may be exemplified by the compounds disclosed in Japanese Unexamined Patent Publications Nos. 3625/1985 or 10247/1985.

Of these compounds having bonds decomposable with an acid, compounds having →Si—O—C← bonds are preferred. Among them, the compounds having at least one →Si—O—C← bond and also at least one hydrophilic group disclosed in Japanese Unexamined Patent Publication No. 121446/1985 are particularly preferred.

These compounds decomposable with acid may be used singly as only one kind, or as a mixture of two or more kinds.

The content of these compounds decomposable with acid may be preferably 5 to 70% by weight more preferably 10 to 50% by weight based on the total solids of the photosensitive resist forming composition.

As the phenols of (iii), a mixture of two kinds of novolak resins containing only one kind of phenol (the phenol components of the respective novolak resins are different from each other) may be employed, but preferably a copolycondensate of two different kinds of phenols and an active carbonyl compound can be used.

Examples of the binder may include acrylic acid or methacrylic acid and alkyl esters or sulfoalkyl esters thereof, phenol resins, polyvinylbutyral, polyacrylamide, cellulose derivatives such as ethyl cellulose, cellulose acetate butyrate, cellulose acetate propionate, cellulose acetate, benzyl cellulose, cellulose propionate, etc., or otherwise polystyrene, polyvinyl chloride, chlorinated rubber, polyisobutylene, polybutadiene, polyvinyl acetate and copolymers thereof, cellulose acetate, cellulose propionate, cellulose acetate phthalate, etc.

In the present invention, the photographic plate can be utilized variously in addition to those as described above, but typical pattern forming steps are as described below. First, a desired original picture pattern is exposed by a photoplotter onto a photographic plate (for example, directly drawn on the photographic plate by laser beam), and developed to prepare a master pattern (hereinafter called MP). Next, contact printing is effected on another photographic plate, followed by developing to prepare a working pattern (hereinafter called WP). Usually, plural sheets of WP are prepared from one sheet of MP. Then the WP is contact printed onto the surface of a substrate having a resist formed thereon (the resist surface of etching material), followed by developing and etching to obtain a final product having a predetermined pattern.

The present invention can be embodied most preferably as the method using the photographic plate of the present invention as the MP or WP in the steps as described above.

Among them, particularly it is most preferable to use a photographic plate in which the silver halide contained in the emulsion layer on the glass support is a silver iodobromide containing 8 mol % or less of silver iodide and has a mean grain size of 0.1 μm or less as the photographic plate for the MP and a photographic plate in which the silver halide contained in the emulsion layer on the glass support contains at least 50 mol % or more of silver chloride as the photographic plate for the WP.

Of course, the present invention can be applied for other steps than those as described above, for example, the step of printing from the MP directly onto the photoresist, or other various steps.

The present invention is described below by referring to Examples. However, as a matter of course, the present invention is not limited by the examples as described below.

EXAMPLE 1

Preparation of MP

In Example 1, first a Lipman type emulsion as described below was prepared and this was applied on a glass support applied with grinding working to form an emulsion layer.

The recipe of the emulsion used in this example is as described below.

To a Lipman type silver halide emulsion with a mean grain size of 0.05 μm comprising 3 mol % of silver iodide and 97 mol % of silver bromide was added sodium thiosulfate for chemical sensitization, and then the compound (I) having the structure shown below as the sensitizing dye, the compound (II) having the structure shown below as the inhibitor, the following compound (III) as the development accelerator, the following compound (IV) as the film hardener and the compound (V) having the structure shown below as the adhesive with glass were added to prepare a coating solution (gelatin amount was 6.8 g/m² and Ag amount was 2.8 g/m²).

The above emulsion was applied on a glass support surface with grinding working on the surface. The ground glass used as the support was No. 1000, which had a surface roughness of 3.20 μm. This was coated with an emulsion to give a photographic plate with a surface roughness of the emulsion layer of 2.11 μm.

Also, in this example, a backing layer was provided. That is, the backing layer was provided by adding a copolymer of methacrylic acid and a methacrylate as the binder, the compounds (A) and (B) as the light absorption dyes and the compound (VI) having the structure shown below as the adhesive into a solvent mixture of methanol and ethanol and coating the resultant solution.

The compounds used in the emulsion and backing layer are shown below.

Sensitizing dye (I)

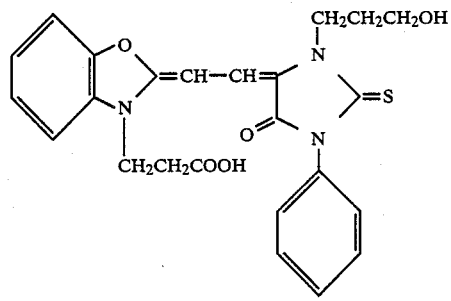

Inhibitor (II)

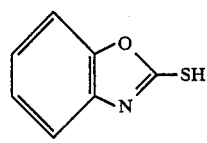

Development accelerator (III)

-continued

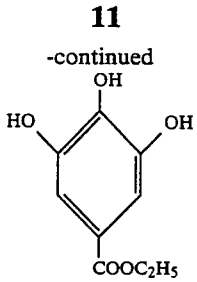

Film hardener (IV)

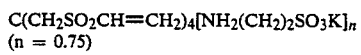

Adhesive with glass (V)

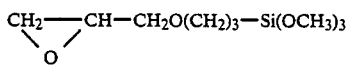

BC dye (A)

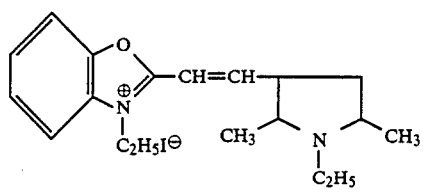

BC dye (B)

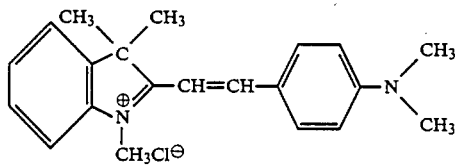

BC adhesive (VI)

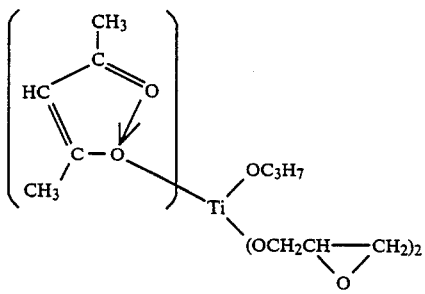

On the photographic plate thus obtained, an original picture pattern was formed by drawing with a laser beam. With this pattern contacted as MP (master pattern) onto a substrate having a photoresist layer as described below, exposure is effected thereon, followed by developing to obtain a resist pattern.

As the substrate having a photoresist, the following substrate was used in this example.

That is, with the use of a steel plate with a plate thickness of 0.15 mm and a width of about 500 mm as the substrate, this was defatted with Triclene and further defatted with an alkali, and the this steel plate was coated with a resist formulated to a specific gravity of 1.030 with casein (SS-16 (trade name) produced by Fuji Yakuhin Kogyo K. K.) and ammonium bichlorate by means of a roll-coating device, followed by transfer of a pattern thereon.

In Example 1, on the steel plate coated with the above coating treatment, the above photographic plate with the dimensions of a plate thickness of about 5 mm and about 559 mm (22 inch)×about 711 mm (28 inch) was contacted, and exposure printing was effected under a metal halide lamp of 4 KW at a distance of 500 mm for 50 seconds. Here, in the above contact working, the aspiration evacuation time was carried as 20 sec., 50 sec., 80 sec., 90 sec., respectively.

For the steel plate coated with the above contact printing, spray developing processing was applied by use of water of 23° C.

Subsequently, the plate was dipped in anhydrous chromic acid solution, washed with water and subjected to burning at 200° C. to 250° C. to apply film hardening treatment. Further, after etching treatment by spraying ferric chloride solution, the plate was washed with water and subjected to etching to obtain a product having a circuit with a desired pattern.

COMPARATIVE EXAMPLE 1

As contrasted to the above Example 1 in which photographic plate having MP formed on No. 1000 ground glass as a support, for comparison, photographic plate by using smooth surface glass applied without grinding working was used as the support. Other conditions were the same as in the above Example 1.

By use of the sample of Example 1 and Comparative example 1, the relationship of the surface roughness of glass support therebetween and that of emulsion layer therebetween was examined to give the results shown in the Table 1 below.

TABLE 1

| | Glass support used | Surface roughness of glass support | Surface roughness of emulsion layer |
|---|---|---|---|
| Comparative example 1 | Smooth surface | — | — |
| Example 1 | No. 1000 grinding working | 3.20 μm | 2.11 μm |

For the above Example 1 and Comparative example 1, the etching situation of the product obtained was examined as described below.

That is, the resist surface was peeled off by dipping in a solution in which several % of a surfactant was added to 20% caustic soda, and after washing the etching situation was confirmed. The results are shown in the following Table 2.

TABLE 2

| | 20 sec. | 50 sec. | 80 sec. | 90 sec. |
|---|---|---|---|---|
| Comparative example 1 | x | x | x | o |
| Example 1 | o | o | o | o | x: bad etching state
o: good etching state

As described in Table 2, according to this example, pattern transfer can be realized with good etching at an aspiration time of 20 seconds.

As described above, according to the present invention sufficient contact can be made in pattern transfer, whereby there can be obtained the effect that copied pattern with good image quality can be obtained and the time required for aspiration evacuation time, etc., can be also shortened. For example, in Examples as described above, since pattern transfer is conducted in number corresponding to the number of the product produced, if, for example, it is supposed that the time can be shortened by 70 seconds based on the above data and 1000 products are produced, the time saved is 70 sec.×1000=70000 sec., namely about 19 hours or longer to improve productivity.

EXAMPLE 2

Preparation of MP

In Example 2, first a Lipman type emulsion as described below was prepared and this was applied on a glass support applied with grinding working to form an emulsion layer.

The recipe of the emulsion used in this example is as described below.

To a Lipman type silver halide emulsion with a mean grain size of 0.05 μm comprising 3 mol % of silver iodide and 97 mol % of silver bromide was added sodium thiosulfate for chemical sensitization, and then the compound (I) having the structure shown below as the sensitizing dye, the compound (II) having the structure shown below as the inhibitor, the following compound (III) as the development accelerator, the following compound (IV) as the film hardener and the compound (V) having the structure shown below as the adhesive with glass were added to prepare a coating solution (gelatin amount was 6.8 g/m² and Ag amount was 2.8 g/m²).

The above emulsion was applied on a glass support surface applied with grinding working on the surface. The ground glass used as the support was No. 1000, which had a surface roughness of 3.20 μm. This was coated with an emulsion to give a photographic plate with a surface roughness of the emulsion layer of 2.11 μm.

Also, in this Example, a backing layer was provided. That is, the backing layer was provided by adding a copolymer of methacrylic acid and a methacrylate as the binder, the compounds (A) and (B) as the light absorption dyes and the compound (VI) having the structure shown below as the adhesive into a solvent mixture of methanol and ethanol and coating the resultant solution.

The compounds used in the emulsion and backing layer are shown below.

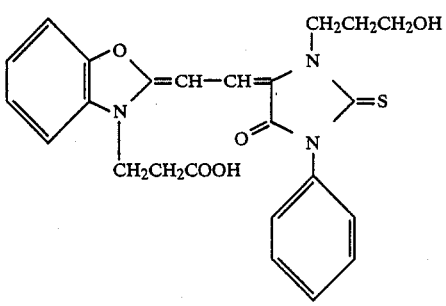

Inhibitor (II)

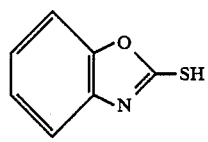

Development accelerator (III)

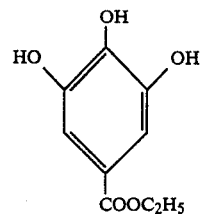

Film hardener (IV)

$C(CH_2SO_2CH=CH_2)_4[NH_2(CH_2)_2SO_3K]_n$
$n = 0.75$

Adhesive with glass (V)

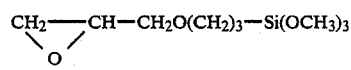

BC dye (A)

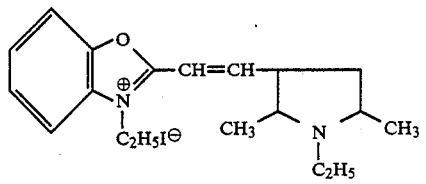

BC dye (B)

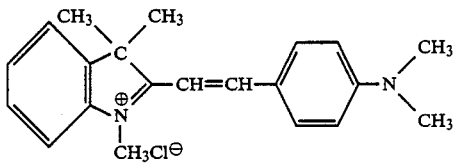

BC adhesive (VI)

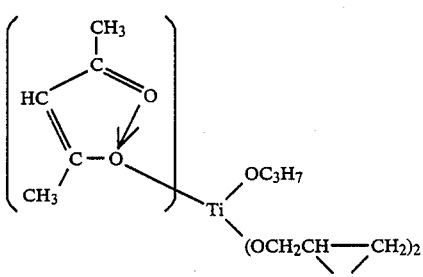

On the photographic plate thus obtained, an original picture pattern was formed by drawing with a laser beam. With this pattern contacted as MP (master pattern) on the photographic plate as described below, exposure is effected thereon, followed by developing to obtain WP (working pattern).

Preparation of photographic plate to be used as WP

The photographic plate to be used as WP was formed by coating a support of a ground glass applied with No. 1000 grinding with a lith emulsion as described below.

The recipe of the lith emulsion in this case is as follows. That is, to a silver halide emulsion comprising 65 mol % of silver chloride and 35 mol % of silver bromide and containing cubic rodium chloride salt with a mean grain size of 0.19 μm was added chloroauric acid and sodium thiosulfate for chemical sensitization, and then the compound VII shown below as the sensitizing dye, 6-methyl-4-hydroxy-1,3,3a,7-tetrazaindene as the stabilizer, the compound VIII having the structure shown below as the inhibitor, the compound IX having the structure shown below as the polymer latex, the above compound IV as a film hardener and the above compound V as the adhesive with a glass support were added to prepare a coating solution (gelatin amount attached 4.1 g/m², silver amount attached 3.5 g/m²).

By coating a glass support applied with No. 1000 grinding working with this coating solution, an emulsion layer with a surface roughness of 2.11 μm was formed.

Also, on this photographic plate was provided a backing layer, which was the same as in the photographic plate emulsion for MP.

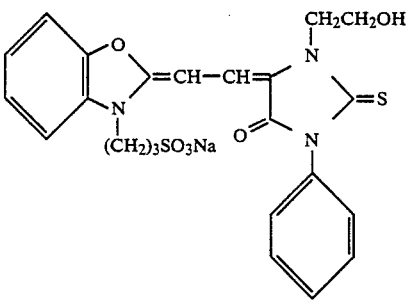

Inhibitor (VIII)

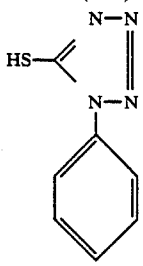

Polymer latex (IX)

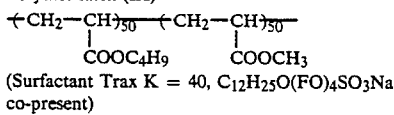

(Surfactant Trax K = 40, $C_{12}H_{25}O(FO)_4SO_3Na$ co-present)

On the photographic plate for WP as obtained above, MP having an original picture pattern formed therefrom by use of a laser beam as described above was contacted and exposed to light to transfer the pattern, followed developing to obtain WP.

COMPARATIVE EXAMPLE 2

As contrasted to the above Example 2 in which photographic plates having MP and WP formed on No. 1000 ground glasses as a support, for comparison, photographic plates by using smooth surface glasses applied with no grinding working were used as the support for both. Other conditions were the same as in the above Example 2.

By use of the samples of Example 2 and Comparative example 2, the relationship of the surface roughness of the glass support therebetween and that of the emulsion layer was examined to give the results shown in the Table 3 below.

TABLE 3

| | Glass support used | Surface roughness of glass support | Surface roughness of emulsion layer |
|---|---|---|---|
| Comparative example 2 | Smooth surface | — | — |
| Example 2 | No. 1000 grinding working | 3.20 μm | 2.11 μm |

As for time shortening, particularly when the aspiration evacuation time during contact is 2 min., 4 min., 6 min., 8 min. and 10 min., the following results in Table 4 were obtained for image quality.

TABLE 4

| | 2 min. | 4 min. | 6 min. | 8 min. | 10 min. |
|---|---|---|---|---|---|
| Comparative example 2 | x | x | x | Δ | Δ |
| Example 2 | Δ | o | o | o | o | x: bad image quality
Δ: slightly good image quality
o: good image quality

EXAMPLE 3

Preparation of MP

In this example, first a Lipman type emulsion as described below was prepared and this was applied on a glass support applied without grinding working to form an emulsion layer.

The recipe of the emulsion used in this example is as described below.

To a Lipman type silver halide emulsion with a mean grain size of 0.05 μm comprising 3 mol % of silver iodide and 97 mol % of silver bromide was added sodium thiosulfate for chemical sensitization, and then the compound (I) having the structure shown below as the sensitizing dye, the compound (II) having the structure shown below as the inhibitor, the following compound (III) as the development accelerator, the following compound (IV) as the film hardener and the compound (V) having the structure shown below as the adhesive with glass were added to prepare a coating solution (gelatin amount was 6.8 g/m² and Ag amount was 2.8 g/m²).

The above emulsion was applied on a glass support surface applied with grinding working on the surface. The ground glass used as the support was No. 1000, which had a surface roughness of 3.20 μm. This was coated with an emulsion to give a photographic plate with a surface roughness of the emulsion layer of 2.11 μm.

Also, in this Example, a backing layer was provided. That is, the backing layer was provided by adding a copolymer of methacrylic acid and a methacrylate as the binder, the compounds (A) and (B) as the light absorption dyes and the compound (VI) having the structure shown below as the adhesive into a solvent mixture of methanol and ethanol and coating the resultant solution.

The compounds used in the emulsion and backing layer are shown below.

Sensitizing dye (I)

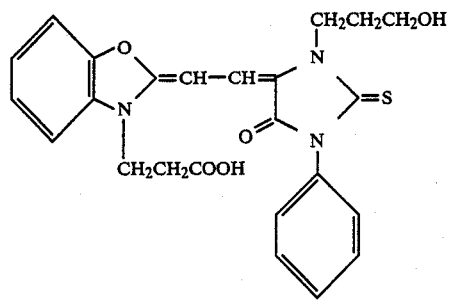

Inhibitor (II)

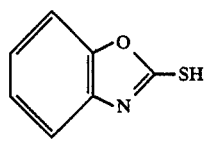

Development accelerator (III)

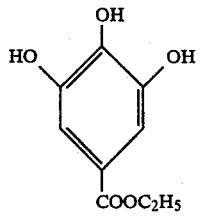

Film hardener (IV)

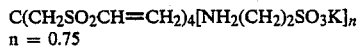

C(CH$_2$SO$_2$CH=CH$_2$)$_4$[NH$_2$(CH$_2$)$_2$SO$_3$K]$_n$
n = 0.75

Adhesive with glass (V)

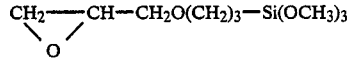

BC dye (A)

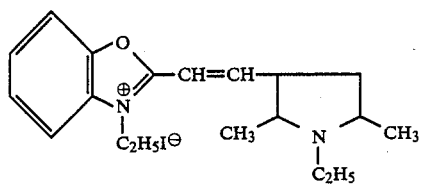

BC dye (B)

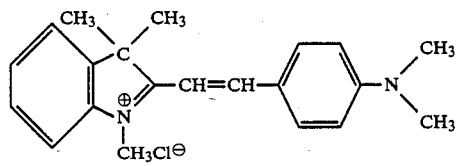

BC adhesive (VI)

-continued

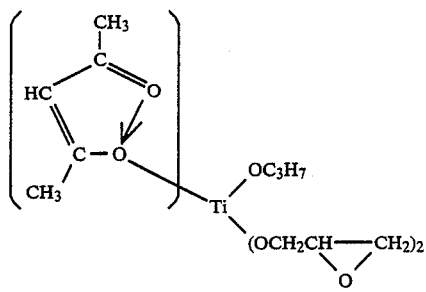

On the photographic plate thus obtained, an original picture pattern was formed by drawing with a laser beam. With this pattern contacted as MP (master pattern) on the photographic plate as described below, exposure is effected thereon, followed by developing to obtain WP (working pattern).

Preparation of Photographic Plate to Be Used as WP

The photographic plate to be used as WP was formed by coating a support of a ground glass applied with No. 1000 grinding with a lith emulsion as described below.

The recipe of the lith emulsion in this case is as follows. That is, to a silver halide emulsion comprising 65 mol % of silver chloride and 35 mol % of silver bromide and containing cubic rodium chloride salt with a mean grain size of 0.19 μm was added chloroauric acid and sodium thiosulfate for chemical sensitization, and then the compound VII shown below as the sensitizing dye, 6-methyl-4-hydroxy-1,3,4a,7-tetrazaindene as the stabilizer, the compound VIII having the structure shown below as the inhibitor, the compound IX having the structure shown below as the polymer latex, the above compound IV as a film hardener and the above compound V as the adhesive with a glass support were added to prepare a coating solution (gelatin amount attached 4.1 g/m$^2$, silver amount attached 3.5 g/m$^2$).

By coating a glass support applied with No. 1000 grinding working with this coating solution, an emulsion layer with a surface roughness of 2.11 μm was formed.

Also, on this photographic plate was provided a backing layer, which was the same as in the photographic plate emulsion for MP.

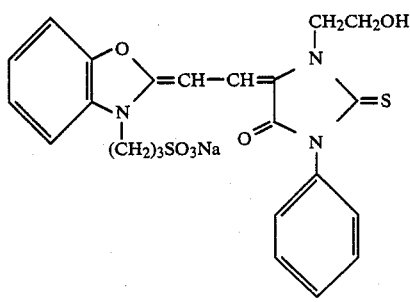

Inhibitor (VIII)

-continued

[Structure: 1-phenyl-5-mercaptotetrazole]

HS—C(=N—N)—N(N=N)—C6H5

Polymer latex (IX)

$+CH_2—CH\overline{)_{50}}+CH_2—CH\overline{)_{50}}+$
        |                    |
     COOC$_4$H$_9$      COOCH$_3$ (Surfactant Trax K = 40, C$_{12}$H$_{25}$O(FO)$_4$SO$_3$Na co-present)

On the photographic plate for WP as obtained above, MP having an original picture pattern formed therefrom by use of a laser beam as described above was contacted and exposed to light to transfer the pattern, followed developing to obtain WP.

COMPARATIVE EXAMPLE 3

As contrasted to the above Example 3 in which photographic plates having MP formed on smooth surface glass as a support and WP formed on No. 1000 ground glass as a support, for comparison, photographic plates by using smooth surface glasses applied without grinding working were used as the support for both. Other conditions were the same as in the above Example 1.

By use of the samples of Example 1 and Comparative example 1, the relationship of the surface roughness of glass support therebetween and that of emulsion layer was examined to give the results shown in the Table 5 below.

TABLE 5

|  | Glass support used | Surface roughness of support | Surface roughness after coating |
|---|---|---|---|
| Comparative example 3 | Smooth surface | — | — |
|  | MP: Smooth surface | — | — |
| Example 3 | WP: No. 1000 grinding working | 3.20 μm | 2.11 μm |

As for time shortening, particularly when the aspiration evacuation time during contact is 2 min., 4 min., 6 min., 8 min. and 10 min., the following results in Table 6 were obtained for image quality.

TABLE 6

|  | 2 min. | 4 min. | 6 min. | 8 min. | 10 min. |
|---|---|---|---|---|---|
| Comparative example 3 | x | x | x | Δ | Δ |
| Example 3 | Δ | Δ | o | o | o | x: bad image quality
Δ: slightly good image quality
o: good image quality

EXAMPLE 4

The WP obtained in Example 2 was transferred onto a substrate having a photoresist formed thereon to obtain a resist pattern. As the substrate having a photoresist, the following substrate was used in this example.

That is, with the use of a steel plate with a plate thickness of 0.15 mm and a width of about 500 mm as the substrate, this was defatted with Triclene and further defatted with an alkali, and then this steel plate was coated with a resist formulated to a specific gravity of 1.030 with casein (SS-16 (trade name) produced by Fuji Yakuhin Kogyo K. K.) and ammonium bichlorate by means of a roll-coating device, followed by transfer of a pattern thereon.

In this example, on the steel plate coated with the above coating treatment, the above photographic plate with the dimensions of a plate thickness of about 5 mm and about 559 mm (22 inch)×about 711 mm (28 inch) was contacted, and exposure printing was effected under a metal halide lamp of 4 KW at a distance of 500 mm for 50 seconds. Here, in the above contact working, the aspiration evacuation time was varied as 20 sec., 50 sec., 80 sec., 90 sec., respectively.

For the steel plate completed of the above contact printing, spray developing processing was applied by use of water of 23° C.

Subsequently, the plate was dipped in anhydrous chromic acid solution, washed with water and subjected to burning at 200° C. to 250° C. to apply film hardening treatment. Further, after etching treatment by spraying ferric chloride solution, the plate was washed with water and subjected to etching to obtain a product having a circuit with a desired pattern.

COMPARATIVE EXAMPLE 4

Also, in Example 4, a glass applied without grinding working was used as the support for comparative purpose, and otherwise the same operations as described above were practiced.

For the above Example 4 and Comparative example 4, the etching situation of the product obtained was examined as described below.

That is, the resist surface was peeled off by dipping in a solution in which several % of a surfactant was added to 20% caustic soda, and after washing the etching situation was confirmed. The results are shown in the following Table 7.

TABLE 7

|  | 20 sec. | 50 sec. | 80 sec. | 90 sec. |
|---|---|---|---|---|
| Comparative example 2 | x | x | x | o |
| Example 2 | o | o | o | o | x: bad etching state
o: good etching state

As described in Table 7, according to this example, pattern transfer can be realized with good etching at an aspiration time of 20 seconds.

As described above, according to the present invention sufficient contact can be made in pattern transfer, whereby there can be obtained the effect that copied pattern with good image quality can be obtained and the time required for aspiration evacuation time, etc., can be shortened. For example, in the Examples as described above, since pattern transfer is conducted in number corresponding to the number of the product produced, if, for example, it is supposed that the time can be shortened by 70 seconds based on the above data and 1000 products are produced, the time saved is 70 sec.×1000=70000 sec., namely about 19 hours or longer to improve productivity.

We claim:

1. A pattern transfer method comprising forming an original picture pattern on a first photographic plate having a silver halide emulsion layer on a glass support and transferring said original picture pattern by contact exposure onto a substrate having a photoresist layer,
   characterized in that said first photographic plate comprises a silver halide emulsion contained in the emulsion layer which is a silver iodobromide emulsion containing 8 mol % or less of silver iodide and having a mean grain size of 0.1 μm or less; or contains a silver halide emulsion in said emulsion layer which contains 50 mol % or more of silver chloride; and
   that said first photographic plate has an emulsion layer with surface roughness of 0.3 μm to 3 μm, said surface roughness obtained by roughening the surface of said glass support.

2. A pattern transfer method comprising forming an original picture pattern on a first photographic plate having a silver halide emulsion layer on a glass support and transferring said original picture pattern by contact exposure onto a second photographic plate having a silver halide emulsion layer on a glass support,
   characterized in that said first and second photographic plates comprise a silver halide emulsion contained in the emulsion layer which is a silver iodobromide emulsion containing 8 mol % or less of silver iodide and having a mean grain size of 0.1 μm or less; or contains a silver halide emulsion in said emulsion layer which contains 50 mol % or more of silver chloride; and
   that at least said second photographic plate of said plates has an emulsion layer with surface roughness of 0.3 μm to 3 μm, said surface roughness obtained by roughening the surface of said glass support of said second photographic plate.

3. The pattern transfer method according to claim 2, wherein the first photographic plate comprising a silver halide emulsion layer on a glass support with the silver halide emulsion contained in said emulsion layer being a silver iodobromide emulsion containing 8 mol % or less of silver iodide and having a mean grain size of 0.1 μm or less is used,
   an original picture pattern is formed on said first photographic plate,
   said original picture pattern is contact transferred onto the second photographic plate having a silver halide emulsion layer on a glass support with the silver halide contained in said emulsion layer containing at least 50 mol % or more a silver chloride, and
   at least said second photographic plate has its emulsion layer with a surface roughness of 0.3 μm to 3 μm, said surface roughness obtained by roughening the surface of said glass support of said second photographic plate.

4. The pattern transfer method according to claim 3, wherein said second photographic plate having a silver halide emulsion layer of a glass support with the silver halide emulsion contained in said emulsion layer containing 50 mol % or more of silver chloride and with the surface roughness of said emulsion layer being 0.3 μm to 3 μm is used, said surface roughness obtained by roughening the surface of said glass support of said second photographic plate.
   an original picture pattern on said first photographic plate is formed on said second photographic plate, and
   said pattern on said second photographic plate is transferred by contact exposure onto a substrate having a photoresist layer on a support.

* * * * *

UNITED STATES PATENT AND TRADEMARK OFFICE
CERTIFICATE OF CORRECTION

PATENT NO. : 4,891,296

DATED : January 02, 1990

INVENTOR(S) : Shigeru Tsurukiri et al.

It is certified that error appears in the above-identified patent and that said Letters Patent is hereby corrected as shown below:

Claim 3, column 22, line 14, change "a" to --of--.

Claim 4, column 22, line 29, change "." to --,--.

Signed and Sealed this

Sixteenth Day of July, 1991

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,891,296
DATED : January 02, 1990
INVENTOR(S) : Shigeru Tsurukiri et al.

It is certified that error appears in the above-identified patent and that said Letters Patent is hereby corrected as shown below:

Cover page, Assignee, line 2: after "Tokyo, Japan" insert

--and Dainippon Screen Mfg. Co., Ltd., Kyoto-shi, Japan--.

Signed and Sealed this

Twenty-eighth Day of January, 1992

Attest:

HARRY F. MANBECK, JR.

*Attesting Officer*   *Commissioner of Patents and Trademarks*